(12) United States Patent
Howell et al.

(10) Patent No.: US 7,091,871 B2
(45) Date of Patent: Aug. 15, 2006

(54) ELECTRICAL HAZARD DETECTION SYSTEM

(76) Inventors: Edward Keith Howell, 124 Eagle Rock Trail, Hendersonville, NC (US) 28739-9349; Earl W. Roberts, 8 Brandon La., Mystic, CT (US) 06355-0037

( * ) Notice: Subject to any disclaimer, the term of this patent is extended or adjusted under 35 U.S.C. 154(b) by 88 days.

(21) Appl. No.: 10/899,481

(22) Filed: Jul. 26, 2004

(65) Prior Publication Data

US 2006/0017446 A1 Jan. 26, 2006

(51) Int. Cl.
*G08B 21/00* (2006.01)

(52) U.S. Cl. .................... 340/649; 340/650; 340/653
(58) Field of Classification Search ............. 340/649, 340/650, 653, 656, 870.16; 307/5, 116, 125, 307/147; 361/42, 49, 56, 118; 324/133
See application file for complete search history.

(56) References Cited

U.S. PATENT DOCUMENTS

| 4,551,633 A | * | 11/1985 | Winter et al. ............ 307/147 |
| 5,051,732 A | * | 9/1991 | Robitaille ................ 340/650 |
| 5,105,325 A | * | 4/1992 | Lawrence ................. 361/42 |
| 5,783,875 A | * | 7/1998 | Jaros ...................... 307/116 |

* cited by examiner

*Primary Examiner*—Van T. Trieu
(74) *Attorney, Agent, or Firm*—Quarles & Brady Streich Lang, LLP

(57) ABSTRACT

An electrical hazard detection system is used to detect energized ground terminals on electric receptacles. This condition may not be detectable by traditional circuit testers when hot and neutral wires have been switched and ground terminals have been electrically connected to the neutral wires. The user's body is used to provide a high-impedance path to true ground thereby creating an electric current from an energized ground terminal, activating a transistor, and illuminating an associated indicator.

25 Claims, 5 Drawing Sheets

ELECTRICAL HAZARD DETECTION SYSTEM

BACKGROUND OF THE INVENTION

1. Field of the Invention

This invention is related in general to the field of electric energy detection systems. In particular, the invention consists of a device used to detect an energized equipment-grounding terminal in an electrical receptacle.

2. Description of the Prior Art

In a common wall receptacle outlet, an ungrounded circuit conductor, usually black, is customarily connected to a supply side of an electrical distribution system, and a grounded circuit conductor, usually white, is connected to a neutral side of the electrical distribution system. The grounded conductor provides a reference voltage for the receptacle outlet and is referred to as the "neutral". The electric potential of the ungrounded conductor, relative to the neutral conductor, is defined as the line voltage, and the conductor is referred to as the "line" or "hot" conductor.

Modern electrical distribution systems typically include a third wire, a normally non-current-carrying equipment grounding conductor. This conductor provides a low impedance path for ground-fault currents necessary to activate over-current devices and also equalizes the potential between exposed metal surfaces. This equipment grounding conductor, for purposes of this disclosure, will be referred to as the "ground", and the other two, normally current-carrying conductors, will be referred to as the "hot" and "neutral".

Modern 125 volt receptacles typically have three terminals that correspond to the hot, neutral, and ground. These terminals are marked and color-coded, and only the corresponding conductors are supposed to be connected to the terminals Circuit detection devices ("testers") are commonly used to determine whether the terminals of an electrical receptacle have been properly connected to the electrical distribution system. These testers are typically small plug-in devices that are inserted into the receptacle and provide an indication of the electric potential between the hot, neutral, and ground wires.

A typical tester may have up to three lamps for indicating electric potential between conductors. A first lamp, "Lamp 1", is connected between the hot and neutral terminals of the receptacle. If the lamp illuminates, an electric potential exists between the two terminals. A second lamp, "Lamp 2", is placed between the hot and ground terminals to indicate whether an electric potential exists between these two terminals as well. A third lamp, "Lamp 3", is typically inserted between the neutral and ground terminals to serve the same function.

Using this type of tester, a normal condition is indicated by an illumination of the first and second lamps only, showing that an electric potential exists between the hot and neutral terminals and between the hot and ground terminals, but any electric potential between the neutral and ground terminals is less than that necessary to illuminate the third lamp. Lamps may be selected to indicate various levels of electric potential between the conductors. However, a typical lamp that is illuminated is intended to represent approximately 120 volts alternating current between conductors and a non-illuminated lamp is intended to represent little or no electric potential between conductors.

A normal condition exists when Lamp 1 and Lamp 2 only are lit. If Lamps 1 and 3 are lit, the Hot and Neutral are reversed. If Lamps 2 and 3 are lit, the Hot and Ground are reversed. If only Lamp 2 is lit, there is an open Neutral. If only Lamp 1 is lit, there is an open Ground. If no lamp is lit, there is an open Hot.

A typical tester is capable of detecting the mis-wiring conditions indicated above. However, there have been instances resulting in fatalities wherein the ground wire is not connected to a receptacle, the hot and neutral wires have been reversed, and the neutral and ground terminals have been electrically connected together, either with a jumper or wire. This condition is not typically detectable by today's circuit testers and is likely to occur when a modern three-terminal receptacle is installed in a two-wire electrical distribution system having only hot and neutral conductors. If the hot and neutral conductors are interchanged somewhere within the distribution system, or if they are connected to the wrong terminals at the receptacle, the neutral terminal is energized at line potential and the line terminal is grounded at the service entrance.

Under these conditions, if a connection is made, either intentionally or unintentionally, between the neutral and ground terminals, all exposed metal on the load side of the receptacle will become energized at line potential. With this scenario, all UL listed 3-light circuit testers will indicate a safe condition when in fact there is a serious shock hazard present. There is at least one known documented electric shock fatality traceable to this situation.

Modern electric equipment is often designed to take advantage of an electrical distribution system's ground conductor to prevent accidental injury or electrocution. For example, a modern hand-held drill insulates the hot conductor from exposed metal parts such as the frame or case of the drill. However, if a short should develop between the hot conductor and the frame of the drill, the user is protected because the frame of the drill is customarily connected directly to the ground conductor, allowing current to discharge through the ground wire rather than through the user. If the erroneous wire condition indicated above were to occur, the frame of the drill would not be connected to the electrical distribution system's ground, but rather would be energized. Simply touching the frame may create a circuit between the distribution system's energized supply side and the user, resulting in a severe electric shock that may injure or even kill the user. However, a traditional tester is incapable of detecting this condition.

If a traditional tester is plugged into a receptacle wherein the ground terminal is electrically connected to the neutral terminal and both are connected to the distribution system's hot wire while the hot terminal is connected to the distribution system's neutral wire, then lamps one and two would be illuminated while lamp three would be dark. In this scenario, lamp one would be placed between the now energized neutral terminal and the hot terminal sitting at reference voltage and would light up. Lamp two would be between the now energized ground terminal and the hot terminal sitting at reference voltage and would also light up.

Because both the ground terminal and the neutral terminal are energized, no significant electric potential exists between them, and therefore, lamp three would not be illuminated. The result is that a typical tester would indicate a normal wiring condition of the receptacle when, in fact, a potentially deadly hazard exits. The typical receptacle outlet circuit tester cannot indicate the presence of supply voltage on the ground terminal because the tester has no reference to earth ground. Accordingly, it would be advantageous to have a circuit tester device that can detect this anomalous condition.

SUMMARY OF THE INVENTION

The invention disclosed herein is an electrical hazard detection system (EHDS) used to detect an energized ground terminal in an electrical receptacle utilizing the impedance of the user's body to earth ground as a voltage reference connection. The EHDS may incorporate a traditional circuit tester and includes a first and second zener diode, an n-channel enhancement mode metal-oxide semi-conductor field-effect transistor (MOSFET), a light-emitting diode (LED), and at least two biasing resistors having a relatively high impedance connected to a testing surface that is to be touched by the user to provide a reference to earth ground.

When the electrical receptacle that is being tested is properly connected to an electrical distribution system, electric current passes through the first zener diode, allowing the first lamp of the traditional circuit tester to illuminate. If the ground terminal has been properly grounded, i.e. provided a path to true ground, then the first resistor maintains an effective electric potential between the gate and source of the MOSFET at approximately zero volts, preventing the MOSFET from activating and the LED from illuminating when the user touches the testing surface.

If, however, the receptacle's ground conductor has been connected to the supply side of the electrical distribution system, the second resistor provides a path to ground through the impedance of the user's body. This allows an electric potential to develop over the first resistor, turning on the MOSFET, and allowing current to flow through and illuminate the LED. The second zener diode protects the MOSFET from excessive voltage of either polarity, especially electrostatic discharge (ESD).

One aspect of this invention is that it detects when an electric receptacle's ground terminal has been energized with respect to true ground. Additionally, the second resistor ensures the safety of the device's user when touching the testing surface. The device is simple to use, practical, economical, and small enough to be used effectively with current circuit testers.

Various other purposes and advantages of the invention will become clear from its description in the specification that follows and from the novel features particularly pointed out in the appended claims. Therefore, to the accomplishment of the objectives described above, this invention comprises the features hereinafter illustrated in the drawings, fully described in the detailed description of the preferred embodiments and particularly pointed out in the claims. However, such drawings and description disclose just a few of the various ways in which the invention may be practiced.

DESCRIPTION OF THE PREFERRED EMBODIMENTS

Figure 1:
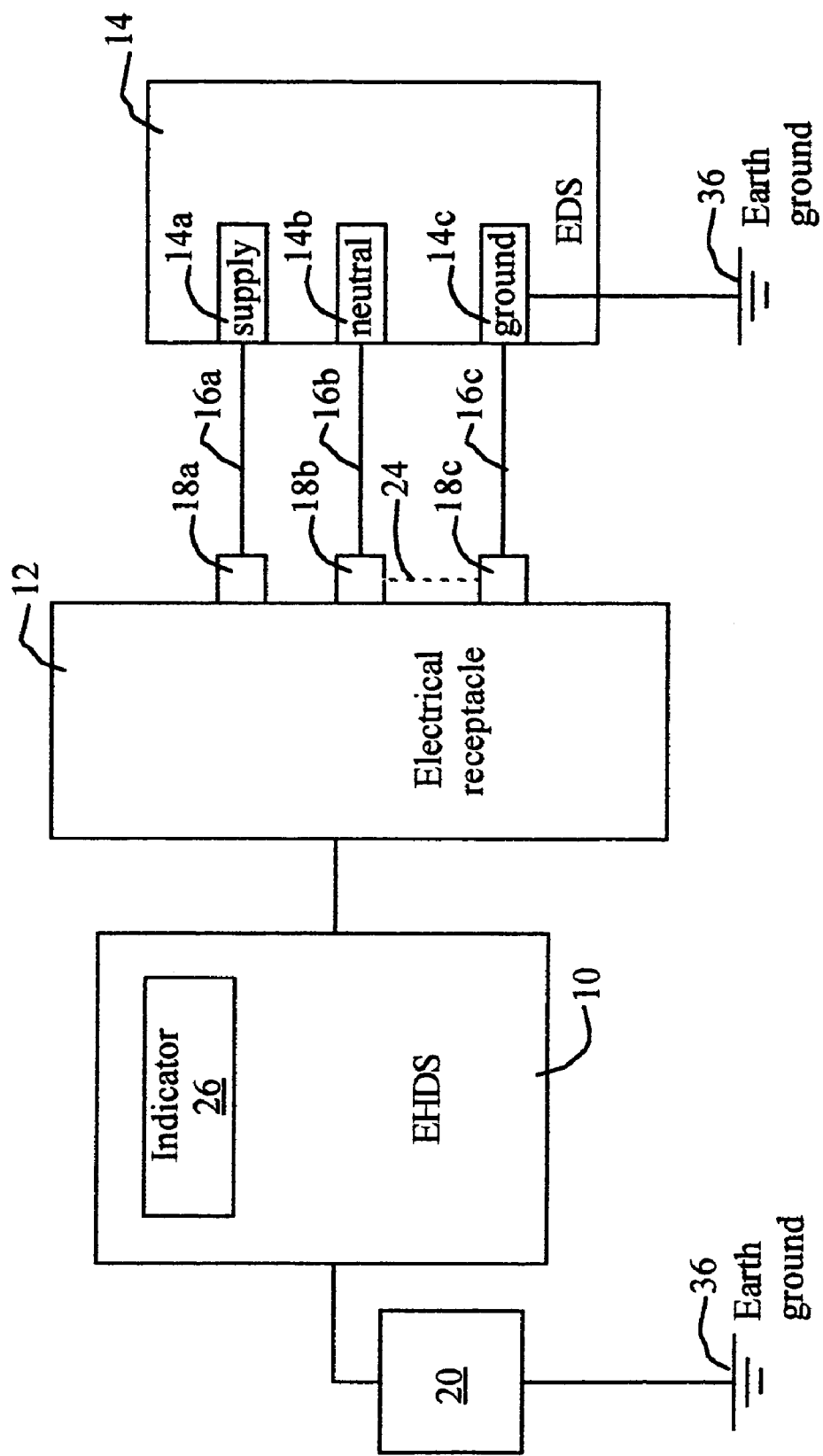
FIG. 1 is a block diagram of an electrical hazard detection system in accordance with the invention, electrically connected to an electrical receptacle, which is, in turn, electrically connected to an electrical distribution system.

This invention is based on the idea of using the impedance of the users body to earth ground to provide a ground reference for an electrical hazard detection system (EHDS) to identify electric receptacles that have not been grounded properly. Referring to the figures, wherein like parts are designated with the same reference numerals and symbols, FIG. 1 is a block diagram depicting an EHDS system 10 electrically connected to an electrical receptacle 12 which is, in turn, electrically connected to an electrical distribution system (EDS) 14 by wires 16a, 16b, 16c. The EDS may be a circuit-breaker panel, fuse-box, or other distribution device intended to provide alternating current electric power to the electrical receptacle 12.

A hot wire 16a connects the supply side 14a of the EDS 14 to a hot terminal 18a on the electric receptacle 12. Likewise, a neutral wire 16b connects the neutral side 14b of the EDS 14 to the neutral terminal 18b and the ground wire 16c connects the EDS ground 14c to the ground terminal 18c of the receptacle. Older electrical distribution systems may not include ground wire 16c, hence the ground terminal 18c of the receptacle 12 may be electrically connected to the neutral terminal 18b of the receptacle 12 with a jumper wire 24, thereby compensating for the absent ground wire 16c. The EHDS 10 includes at least one hot-ground electrical hazard indicator 26 for notifying a user that the receptacle's ground terminal 18c is not at earth ground and is, in fact, energized, as determined by a small current through impedance 20 of the user's body to earth ground 36.

Figure 2:
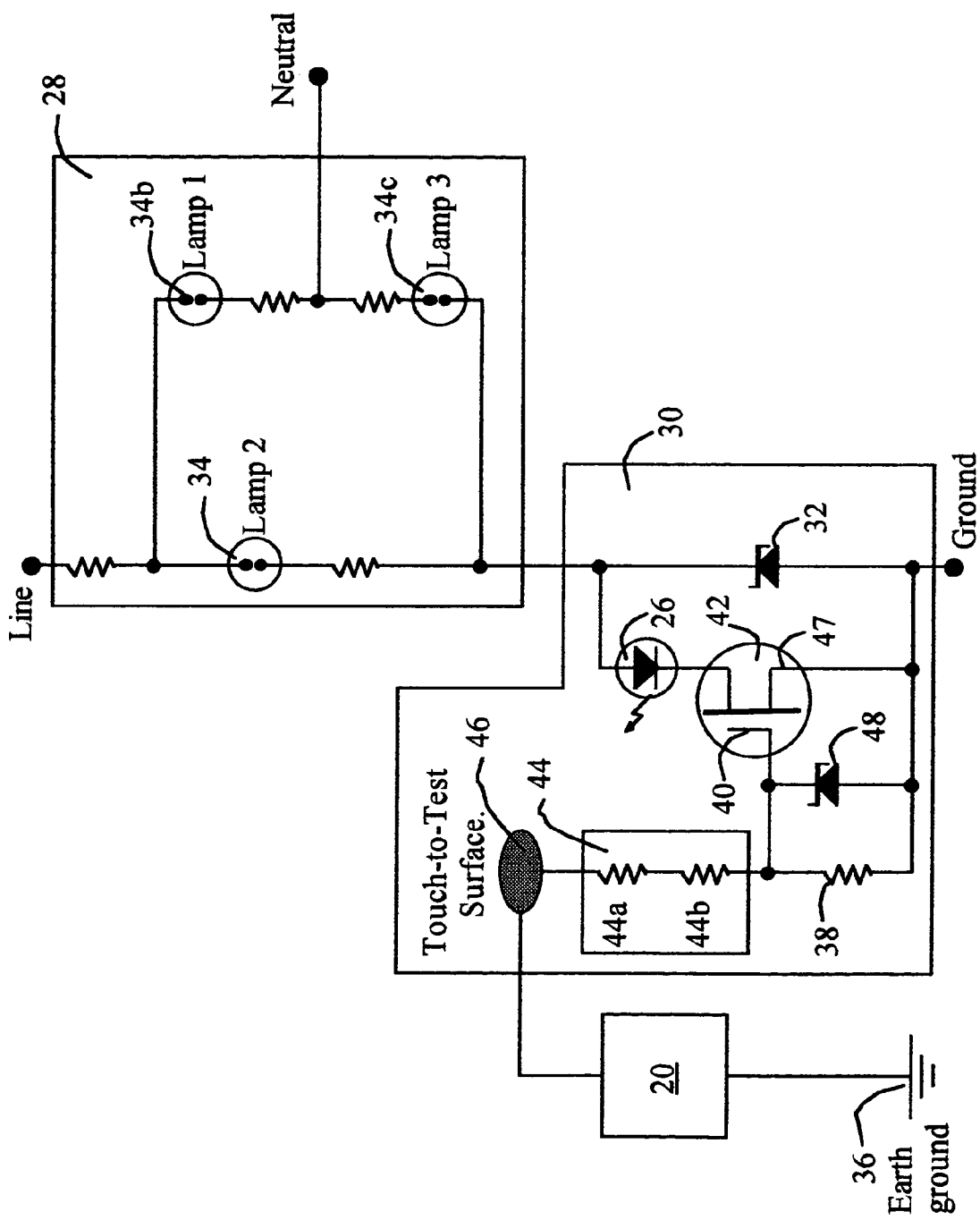
FIG. 2 is a schematic diagram of an electrical hazard detection system electrically connected to a typical receptacle circuit tester.

FIG. 2 is a schematic diagram of one embodiment of the EHDS 10 (FIG. 1). A traditional circuit tester 28 is electrically connected to a hot-ground sensor 30. When the electric receptacle 12 (FIG. 1) is properly connected to the EDS 14 (FIG. 1), electric current passes through a first zener diode 32, allowing the first lamp 34 of the traditional circuit tester 28 to illuminate. If the ground terminal 18c has been properly grounded, i.e., provided a path to true earth ground 36, then a first biasing resistor 38 maintains an effective electric potential at the gate 40 of the transistor 42 of approximately zero volts, preventing the transistor 42 from conducting and the hot-ground electrical hazard indicator 26 from illuminating when the user 20 touches the testing surface 46. The transistor 42 may be a bi-polar junction transistor (BJT) or a field-effect transistor (FET). Additionally, with appropriate circuit modifications, the BJT transistor may be either a p-n-p or an n-p-n device and the FET may be either an enhancement mode or a depletion mode device, n-channel or p-channel, junction FET or metal oxide FET. In this embodiment of the invention, the transistor is an enhancement mode n-channel metal-oxide semi-conductor field-effect transistor (MOSFET). Additionally, in this example of the invention, the hot-ground electrical hazard indicator 26 is a light-emitting diode (LED).

If the receptacle's ground terminal 18c has been connected to the supply side 14a of the electrical distribution system 14, the biasing resistive circuit 44 and the circuit comprised of testing surface 46 and user's body impedance 20 provides a low-current path to earth ground 36. This allows an electric potential to develop across the first biasing resistor 38, activating the transistor 42, and allowing electric current to flow through and illuminate the hot-ground electrical hazard indicator 26. A second zener diode 48 protects the transistor 42 from excessive voltage such as electrostatic discharge (ESD).

A key component of this invention is the testing surface 46. It is important that the testing surface be electrically connected through the impedance 20 of the body of the user to true earth ground 36.

Fortunately, the impedance 20 is primarily the capacitance of the isolated adult human body to earth ground 36, which has been found experimentally to be on the order of at least 30 picoFarads, having a maximum impedance of about 88 megohms at a line frequency of 60 Hertz. At 120 volts, this impedance would produce a current of about 1.4 microamperes, which is generally below perception level of the user. Therefore, an adult human body may by employed as an activation circuit when placed in electric contact with the testing surface 46 and biasing resistive circuit 44. As current flows from the activation circuit through the first biasing resistor 38, an electric potential is created. This voltage also develops between the gate 40 of the MOSFET and its source terminal 47. This is sufficient voltage to activate the MOSFET, allowing electric current to flow through it. In this embodiment of the invention, the biasing resistive circuit 44 limits the maximum current that could flow through the user to an acceptably safe level and includes two discrete resistors 44a, and 44b. This redundancy provides additional safety to the user in case a short circuit develops through one or the other resistor.

Figure 3:
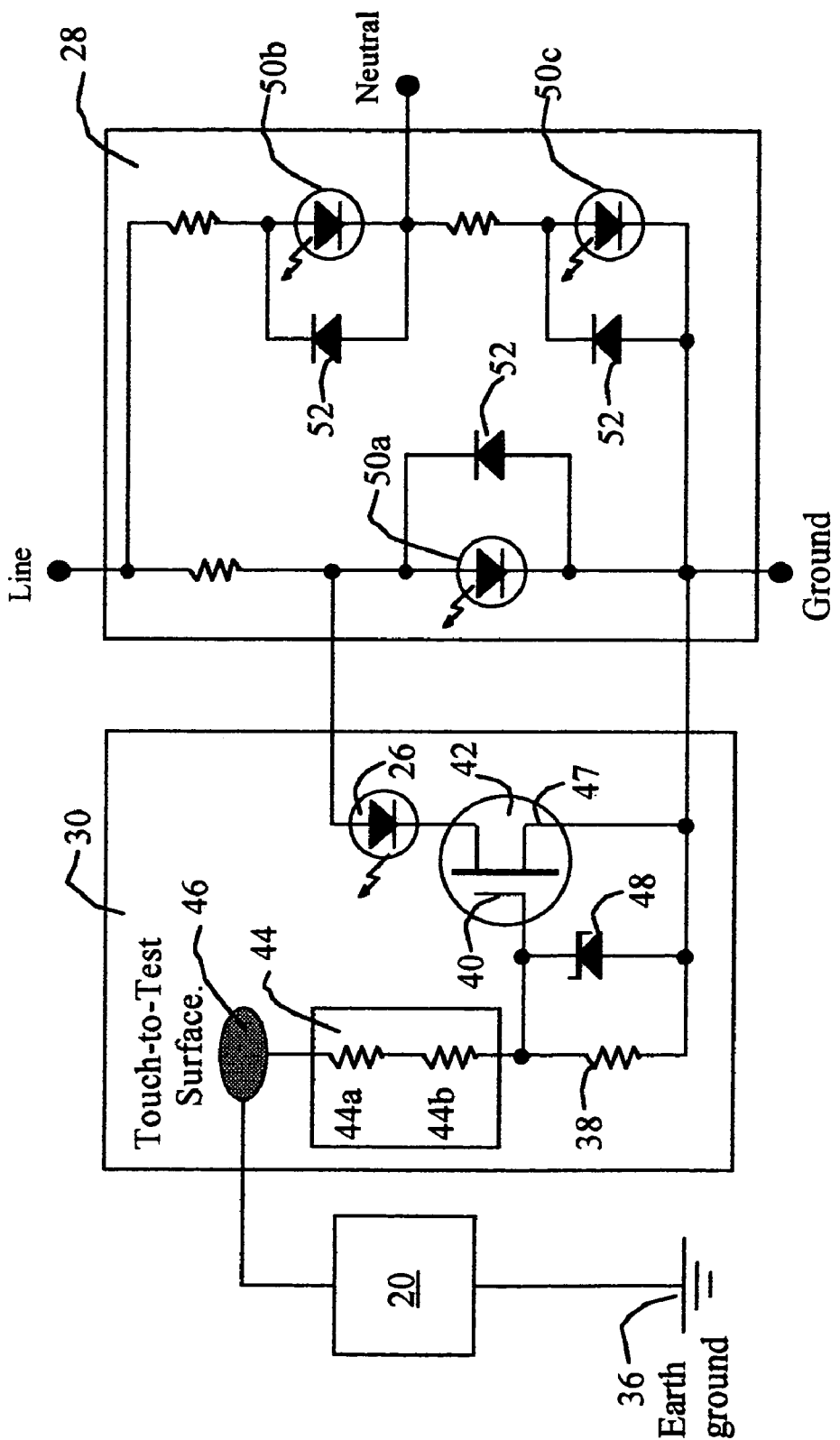
FIG. 3 is a schematic diagram of the electrical hazard detection system of FIG. 2 wherein lamps have been replaced with light-emitting diodes.

In the first embodiment of the invention, as illustrated in FIG. 2, the traditional circuit tester 28 utilized neon glow lamps 34, 34b, 34c. In another embodiment of the invention, as illustrated by the schematic diagram of FIG. 3, the traditional circuit tester utilizes LEDs 50a, 50b, 50c, instead of lamps. Bypass diodes 52 protect the LEDs from reverse voltages of the alternating-current electric power source.

Figure 4:
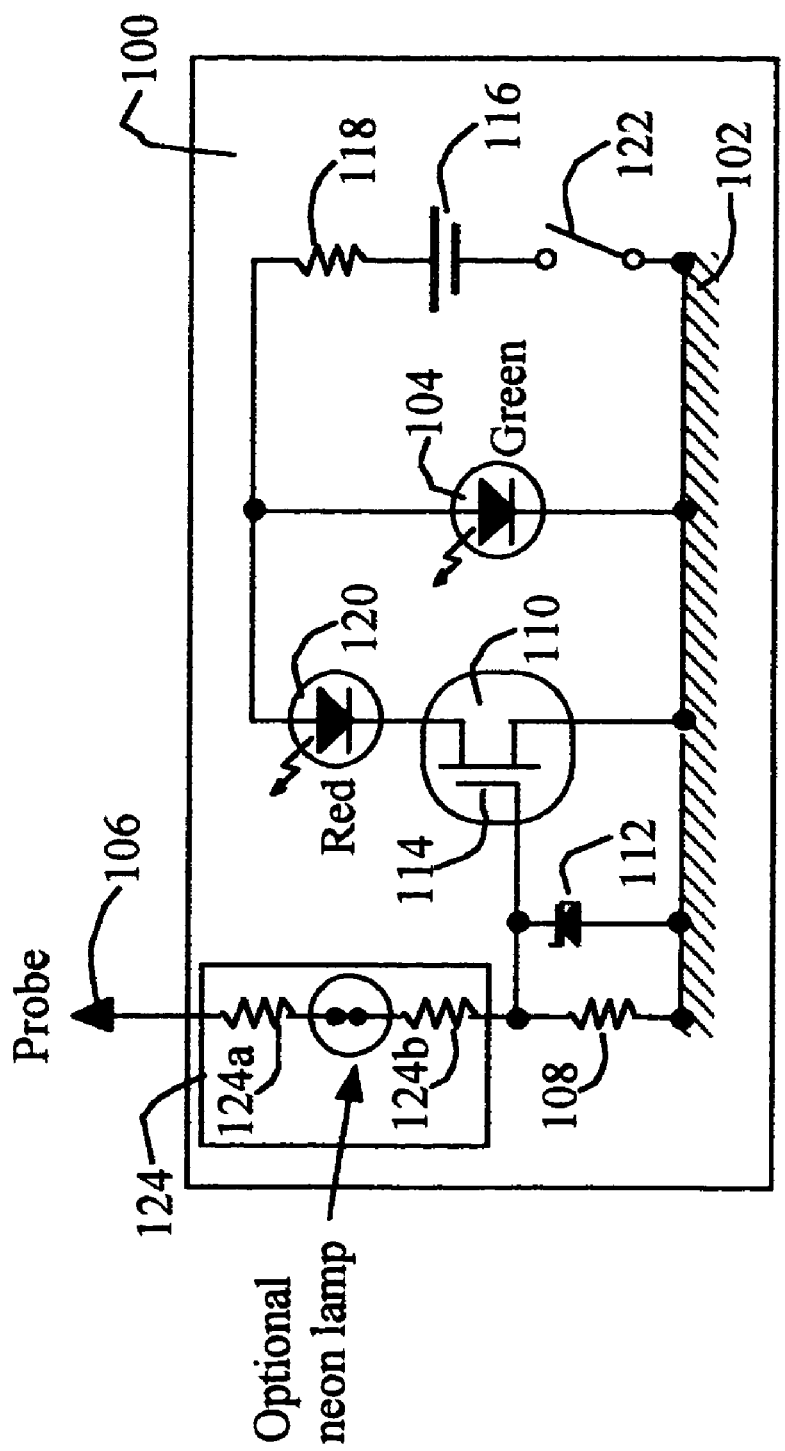
FIG. 4 is a schematic diagram illustrating a self-contained embodiment of the electrical hazard detection system of FIG. 1.

In yet another embodiment of the invention, FIG. 4 illustrates a hand-held EHDS 100 for indicating whether a terminal or conducting surface has a sustainable electric potential with reference to earth ground. This device is useful for identifying energized ground terminals. Additionally, the probe 106 is useful for testing any electrically conductive surface to determine if it is energized.

The case 102 of the EHDS 100 contains or is made of conductive material and provides an electrically conductive path to a user's hand. A positive indicator 104, such as a green LED, notifies the user that the device is operating, with a good battery, and no significant electric potential exists between the user and the material that has been placed in contact with the probe 106. However, a sufficient electric potential at the probe 106 will induce an electric current to flow from the probe to the user's hand. This will create a voltage across the first biasing resistor 108, activating the transistor 110. The biasing zener diode 112 prevents large voltages from developing at the gate 114 of the transistor 110.

When a sufficient voltage develops across the first biasing resistor 108, the transistor 110 is activated and current flows from the battery 116, through the current limiting resistor 118, and through the electrical hazard indicator 120. In this example, the electrical hazard indicator 120 is a red LED. When current flows through the hazard indicator, the electric current flowing through the battery indicator 104 is limited, reducing the amount of illumination provided by the battery indicator. A press-to-test switch 122 is used to complete the electric circuit through the battery 116. As with previous embodiments of the invention, the biasing resistive circuit 124 may be comprised of more than one resistor 124a,124b. Additionally, biasing circuit 124 may contain a series voltage-dropping element, such as a neon lamp or semiconductor, to prevent hazard indication for lower voltages.

Figure 5:
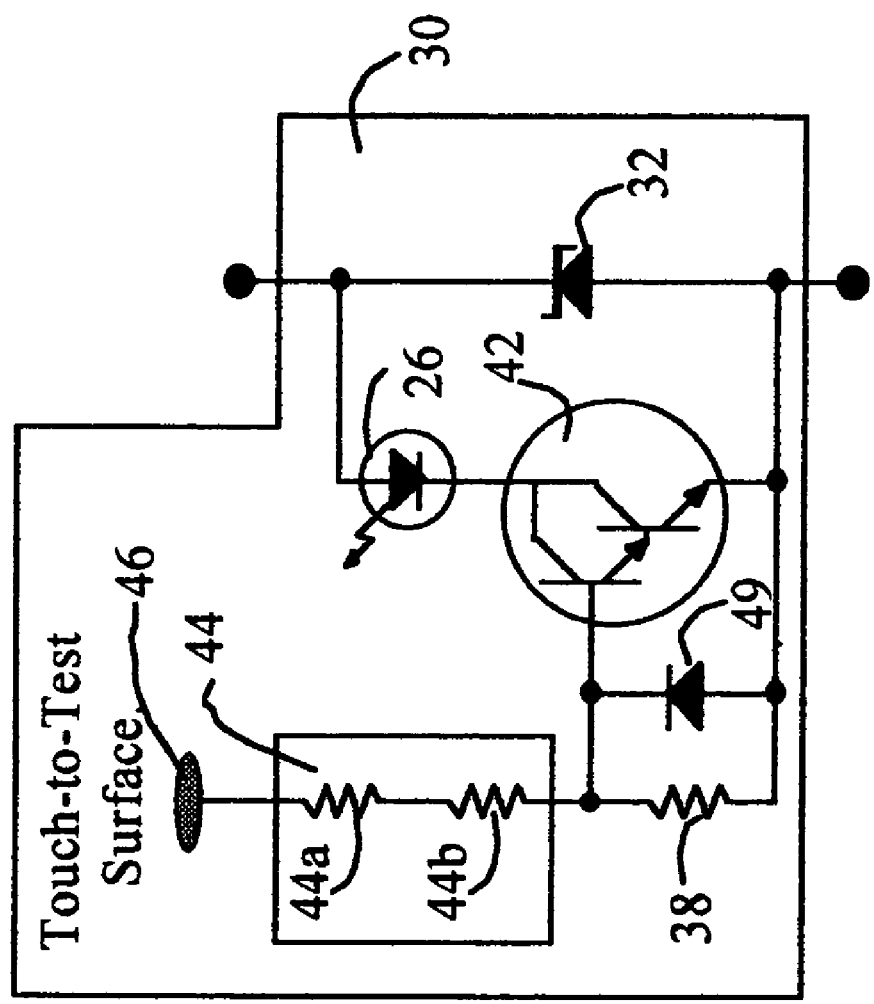
FIG. 5 is a schematic diagram of the electrical hazard detection system portion of FIG. 2 wherein the MOSFET transistor has been replaced with a darlington n-p-n bipolar transistor and one zener diode has been replaced with a basic diode.

In the first embodiment of the invention, as illustrated in FIG. 2, the EHDS utilized a MOSFET as transistor 42. In another embodiment of the invention, as illustrated by the schematic diagram of FIG. 5, the EHDS utilizes a bipolar junction transistor as transistor 42, specifically a darlington connected n-p-n transistor. An ordinary diode 49 replaces zener diode 48 to protect the base of transistor 42 from reverse voltages of the alternating-current electric power source.

Those skilled in the art of electrical hazard detection systems may develop other embodiments of the present invention. For example, biasing resistors may be selected to produce a voltage sufficient to activate the transistor when the energized component is at an electric potential which is significantly greater than or less than the 120 volts of a traditional electric circuit. Therefore, the terms and expressions which have been employed in the foregoing specification are used herein as terms of description and not of limitation, and there is no intention in the use of such terms and expressions of excluding equivalents of the features shown and described or portions thereof, it being recognized that the scope of the invention is defined and limited only by the claims which follow.

We claim:

1. An electrical hazard detection system, comprising:
   an activation circuit for establishing a reference connection to true earth ground;
   an amplifier including a reference terminal, an input terminal, and an output terminal;
   a first electrically conductive test-point electrically connected to the reference terminal of the amplifier;
   a biasing resistor placed between the reference terminal of the amplifier and the input terminal of the amplifier;
   a biasing resistive circuit placed between the input terminal of the amplifier and the activation circuit;
   a second electrically conductive test-point;
   an electrically sensitive indicating device placed between the second electrically conductive test-point and the output terminal of the amplifier;
   wherein, if a first electric potential with respect to true earth ground of the first electrically conductive test-point is applied to the activation circuit and a second electric potential is applied to the second electrically conductive test-point, the activation circuit conducts a first electric current to the first electrically conductive test-point creating a third electric potential at the input terminal of the amplifier with reference to the reference terminal of the amplifier that, in turn, activates the amplifier that, in turn, allows a second electric current to flow from the second electrically conductive test-point through the electrically sensitive indicating device, through the amplifier, and to the first electrically conductive test-point.

2. The electrical hazard detection system of claim 1, wherein the activation circuit is high-impedance path to true earth ground.

3. The electrical hazard detection system of claim 1, wherein the activation circuit is a human body.

4. The electrical hazard detection system of claim 1, wherein the first electrically conductive test-point is electrically connected to a supply-side of an electrical distribution system and the second electrically conductive test-point is electrically connected to an electrical distribution system ground.

5. The electrical hazard detection system of claim 4, wherein the supply-side of the electrical distribution system is electrically connected to an alternating-current voltage source.

6. The electrical hazard detection system of claim 4, wherein the electrical distribution system ground is electrically connected to true earth ground.

7. The electrical hazard detection system of claim 1, wherein the first electrically conductive test-point is electrically connected to a supply-side of an electrical distribution system and the second electrically conductive test-point is electrically connected to an electrical distribution system neutral.

8. The electrical hazard detection system of claim 7, wherein the supply-side of the electrical distribution system is electrically connected to an alternating-current voltage source.

9. The electrical hazard detection system of claim 1, wherein the amplifier is a bi-polar junction transistor.

10. The electrical hazard detection system of claim 9, further comprising a diode electrically connected between the first electrically conductive test-point and a base terminal of the transistor that allows a first electric potential to develop between the first electrically conductive test-point and the base terminal of the transistor and that allows a second electric potential to develop between the base terminal of the transistor and the first electrically conductive test-point.

11. The electrical hazard detection system of claim 1, wherein the amplifier is a field-effect transistor.

12. The electrical hazard detection system of claim 11, further comprising a zener diode electrically connected between the first electrically conductive test-point and a gate terminal of the transistor that allows a first zener electric potential to develop between the first electrically conductive test-point and the gate terminal of the transistor and that allows a second zener electric potential to develop between the gate terminal of the transistor and the first electrically conductive test-point and wherein a first magnitude of the first zener electric potential is less than a second magnitude of the second zener electric potential.

13. The electrical hazard detection system of claim 1, further comprising a zener diode electrically connected between the first electrically conductive test-point and the second electrically-conductive test-point that allows a first zener electric potential to develop between the first electrically conductive test-point and the second electrically conductive test-point and that allows a second zener electric potential to develop between the second electrically conductive test-point and the first electrically conductive test-point and wherein a first magnitude of the first zener electric potential is less than a second magnitude of the second zener electric potential.

14. The electrical hazard detection system of claim 1, further comprising a zener diode electrically connected between the first electrically conductive test-point and the input terminal of the amplifier that allows a first zener electric potential to develop between the first electrically conductive test-point and the input terminal of the amplifier and that allows a second zener electric potential to develop between the input terminal of the amplifier and the first electrically conductive test-point and wherein a first magnitude of the first zener electric potential is less than a second magnitude of the second zener electric potential.

15. The electrical hazard detection system of claim 1, wherein the biasing resistive circuit includes a plurality of resistors.

16. The electrical hazard detection system of claim 1, wherein the electrically sensitive indicating device is a lamp, said lamp illuminating in response to an electric potential between the second electrically conductive test-point and the output terminal of the amplifier.

17. The electrical hazard detection system of claim 1, wherein the electrically sensitive indicating device is a light emitting diode, said light emitting diode illuminating in response to said second electric current.

18. An electrical hazard detection system, comprising:
an activation circuit;
a transistor comprising a gate terminal, an source terminal, and a drain terminal;
a first electrically conductive test-point electrically connected to the source terminal of the transistor;
a biasing resistor placed between the source terminal of the transistor and the gate terminal of the transistor;
a biasing resistive circuit placed between the gate of the transistor and the activation circuit;
a second electrically conductive test-point;
an electrically sensitive indicating device placed between the second electrically conductive test-point and the drain terminal of the transistor;
wherein, if a first electric potential difference exists between the first electrically conductive test-point and the activation circuit and a second electric potential difference exists between the first electrically conductive test-point and the second electrically conductive test-point, the activation circuit conducts a first electric current to the first electrically conductive test-point creating a third electric potential at the gate terminal of the transistor with reference to the source terminal of the transistor that, in turn, activates the transistor that, in turn, allows a second electric current to flow from the second electrically conductive test-point through the electrically sensitive indicating device, through the transistor, and to the first electrically conductive test-point.

19. The electrical hazard detection system of claim 18, wherein the transistor is a field-effect transistor.

20. The electrical hazard detection system of claim 19, wherein the field-effect transistor is a metal-oxide semiconductor field-effect transistor.

21. An electrical hazard detection system, comprising:
a transistor including a first terminal, a second terminal, and a third terminal;
an electric test probe;
a resistor electrically connected between the second terminal and the third terminal;
a resistive circuit electrically connected between the second terminal and the electric test probe;
an activation circuit electrically connected to the third terminal;
a battery;
an electrically sensitive indicating device electrically connected to the first terminal;
a current limiting resistor electrically connected between the electrically sensitive indicating device and the battery; and
a switch electrically connected between the battery and the activation circuit;
wherein, if the switch is closed and a first electric potential difference exists between the activation circuit and the electric test probe, the activation circuit creates a first electric current from the electric test probe creating a second electric potential difference between the second terminal and the third terminal that activates the transistor that, in turn, allows a second electric current to flow from the battery, through the current limiting resistor, through the electrically sensitive indicating device, through the transistor, to the activation circuit.

22. The electrical hazard detection system of claim 21, wherein the transistor is an enhancement mode field-effect transistor.

23. The electrical hazard detection system of claim 21, wherein the resistive circuit includes a voltage-dropping element adapted to prevent a hazard indication for low voltage levels.

24. An electrical hazard detection system, comprising:
   a transistor including a first terminal, a second terminal, and a third terminal;
   an electric test probe;
   a resistor electrically connected between the second terminal and the third terminal;
   a resistive circuit electrically connected between the second terminal and the electric test probe;
   an activation circuit electrically connected to the third terminal;
   a battery;
   an electrically sensitive indicating device electrically connected to the first terminal;
   a current limiting resistor electrically connected between the electrically sensitive indicating device and the battery; and
   a switch electrically connected between the battery and the activation circuit;
   wherein, if the switch is closed and a first electric potential difference exists between the activation circuit and the electric test probe, the activation circuit creates a first electric current from the electric test probe creating a second electric potential difference between the second terminal and the third terminal that activates the transistor that, in turn, allows a second electric current to flow from the battery, through the current limiting resistor, through the electrically sensitive indicating device, through the transistor, to the activation circuit, and said activation circuit includes the impedance of the user's body to earth ground.

25. The electrical hazard detection system of claim 24, wherein the transistor is a bipolar junction transistor.

* * * * *